United States Patent [19]
Bradley

[11] Patent Number: 5,977,779
[45] Date of Patent: Nov. 2, 1999

[54] HANDHELD VECOR NETWORK ANALYZER (VNA) OPERATING AT A HIGH FREQUENCY BY MIXING LO AND RF SIGNALS HAVING OFFSET ODD HARMONICS

[75] Inventor: Donald A. Bradley, Morgan Hill, Calif.

[73] Assignee: Anritsu Company, Morgan Hill, Calif.

[21] Appl. No.: 08/957,261

[22] Filed: Oct. 24, 1997

[51] Int. Cl.⁶ .................................................. G01R 23/14
[52] U.S. Cl. .......................... 324/638; 324/642; 324/650; 324/76.23; 324/76.27
[58] Field of Search ............................. 324/76.26, 76.27, 324/76.23, 76.43, 76.44, 642, 646, 638, 650

[56] References Cited

U.S. PATENT DOCUMENTS

| | | |
|---|---|---|
| 3,808,526 | 4/1974 | Jackson . |
| 4,415,854 | 11/1983 | Remy ..................................... 324/76.43 |
| 4,510,440 | 4/1985 | Ryder . |
| 4,527,116 | 7/1985 | Sorba et al. . |
| 4,808,913 | 2/1989 | Grace ..................................... 324/58 B |
| 4,943,787 | 7/1990 | Swapp . |
| 5,016,202 | 5/1991 | Seibel et al. . |
| 5,113,094 | 5/1992 | Grace et al. ............................. 307/529 |
| 5,140,703 | 8/1992 | Payne . |
| 5,146,171 | 9/1992 | Bradley ................................... 324/642 |
| 5,317,284 | 5/1994 | Yang . |
| 5,434,888 | 7/1995 | Fukuchi . |
| 5,524,281 | 6/1996 | Bradley et al. . |
| 5,642,039 | 6/1997 | Bradley ................................... 324/646 |

FOREIGN PATENT DOCUMENTS

| | | |
|---|---|---|
| 2 209 841 | 5/1989 | United Kingdom ........... G01R 27/06 |
| WO 96 19735 | 6/1996 | WIPO . |

OTHER PUBLICATIONS

Day, Chris, "Design Considerations for Maximizing the Performance/Cost Ratio in an RF Economy Network Analyzer", *Conference Proceedings RF Expo West 1995*, EMC/ESD International, San Diego, Jan. 29–Feb. 1, 1995.

David: "Improved Millimeter Analysis . . . "—Apr. 1984 MW Symposium—Hewlett–Packard.

*Primary Examiner*—Josie Ballato
*Assistant Examiner*—Jose M. Solis
*Attorney, Agent, or Firm*—Fliesler, Dubb, Meyer & Lovejoy

[57] ABSTRACT

A vector network analyzer (VNA) has a first harmonic generator multiplying an RF signal by an odd number M1 to produce incident and reflected test signals received at inputs of mixers providing IF signals. A second harmonic generator multiplies an LO signal by an odd number M2 offset by 2 from M1 to provide signals to additional inputs of the mixers providing IF signals. With the harmonic generators providing odd harmonics separated by 2, a single filter removes remaining harmonics from IF signals provided from each mixer. Each harmonic generator includes two step recovery diodes (SRDs) with opposing ends connecting the signal path to ground, the SRDs functioning to cancel even harmonics. A first coupler provides the output of the first harmonic generator to the mixers, the first coupler having a minimal size enabling its output power to increase with frequency. With the first harmonic generator having power decreasing with frequency and the first coupler having power increasing with frequency, the VNA test signal will have a substantially flat power vs. frequency response. Additional couplers having a minimal size provide the incident and reflected test signals to the mixers. With the second harmonic generator providing a LO signal with power decreasing with frequency to the mixers, and the additional couplers providing power increasing with frequency, the IF signals from the mixers will also have a flat power vs. frequency response.

12 Claims, 4 Drawing Sheets

HANDHELD VECOR NETWORK ANALYZER (VNA) OPERATING AT A HIGH FREQUENCY BY MIXING LO AND RF SIGNALS HAVING OFFSET ODD HARMONICS

BACKGROUND OF THE INVENTION

1. Field of the Invention

The present invention relates to a VNA with circuitry to provide a high frequency test signal by providing an RF signal through a harmonic generator. More particularly, the present invention relates to such circuitry configured for use in a handheld VNA.

2. Description of the Related Art

VNAs transmit a microwave signal to a test device and receive a return signal to enable characterization of the test device. With a VNA, a user can easily identify a fault in a test device, such as a transmission line, and measure the distance from the VNA to the fault or discontinuity. Test measurements are first typically made using a VNA operating in the frequency domain to determine whether a fault exists as indicated by an undesirable standing wave ratio (SWR). If a fault is discovered, an analysis of the results derived from the frequency domain measurement is made in the time domain to locate the position of the fault.

A VNA also enables calibration to extend a VNA test port connection to the end of a cable connected to the test port. By using a VNA to extend the test port to the end of a cable, errors in the cable will not be taken into account when measuring a device through the cable. Scalar devices which measure only amplitude and not phase do not enable extension of the test port to the end of a cable as does a VNA.

A remote transmitter may transmit signals which are received by a device being tested by a VNA. With a tuned receiver, a VNA provides the ability to distinguish such extraneous signals. Scalar devices which receive a broadband of frequencies without discrimination, such as with a tuned receiver, cannot distinguish the extraneous signals.

Most VNAs are large and not easily transportable. Typical VNAs have a housing greater than two feet on a side, and with a power supply may weigh 50 pounds or more. The SiteMaster manufactured by Wiltron Company of Morgan Hill, Calif., in contrast, has dimensions equal to or less than 8 inches by 6 inches by 2½ inches and a weight of less than three pounds, including batteries, when operating over a 25 MHz to 3.3 GHz frequency range. With such weight and size, the SiteMaster can be easily transported by one person. Components used in the SiteMaster are described in U.S. Pat. No. 5,642,039, entitled "Handheld Vector Network Analyzer", and incorporated herein by reference.

SUMMARY OF THE INVENTION

The present invention enables increasing the test signal frequency of the handheld VNA described in U.S. Pat. No. 5,642,039 without providing a significant increase in size, weight, or power consumption so that the VNA can still be easily transported by one person.

The present invention is a circuit for a VNA including a first harmonic generator which multiplies an RF signal by an odd number M1 to produce incident and reflected test signals which are received at inputs of mixers providing IF signals. A second harmonic generator is also included in the VNA for multiplying a LO signal by an odd number M2 offset by 2 from M1 to provide signals to additional inputs of the mixers providing IF signals. With the harmonic generators providing odd harmonics separated by 2, a single filter removes remaining harmonics from IF signals provided from each mixer.

Each harmonic generator includes two step recovery diodes (SRDs) with opposing ends connecting the signal path to ground. The SRDs connected in an opposing manner cancel even harmonics and enhance odd harmonics provided from the harmonic generators.

The VNA further includes a first coupler for coupling the output of the first harmonic generator to the mixers. The first coupler has a minimal size enabling its output power to increase with its input signal frequency. With the first harmonic generator providing power decreasing with frequency and the first coupler providing power increasing with frequency, the overall test signal provided from the VNA will have substantially a flat power vs. frequency response.

Additional couplers are further used to provide the incident and reflected test signals to the mixers. The additional couplers also have a minimal size to provide output power increasing with input signal frequency. With the second harmonic generator providing a LO signal with power decreasing with frequency to the mixers, the IF signals from the mixers in the VNA will have a flat power vs. frequency response to prevent mixer saturation.

With a limited size for the couplers in the VNA, the size for the overall VNA using harmonic generators to increase test signal frequency can be minimized enabling the VNA to be handheld.

BRIEF DESCRIPTION OF THE DRAWINGS

Further details of the present invention are explained with the help of the attached drawings in which.

DETAILED DESCRIPTION

The present invention includes components for a VNA described in U.S. Pat. No. 5,642,039, referred to previously, and modifies those components as described subsequently to enable the VNA to operate at a higher frequency.

Figure 1:
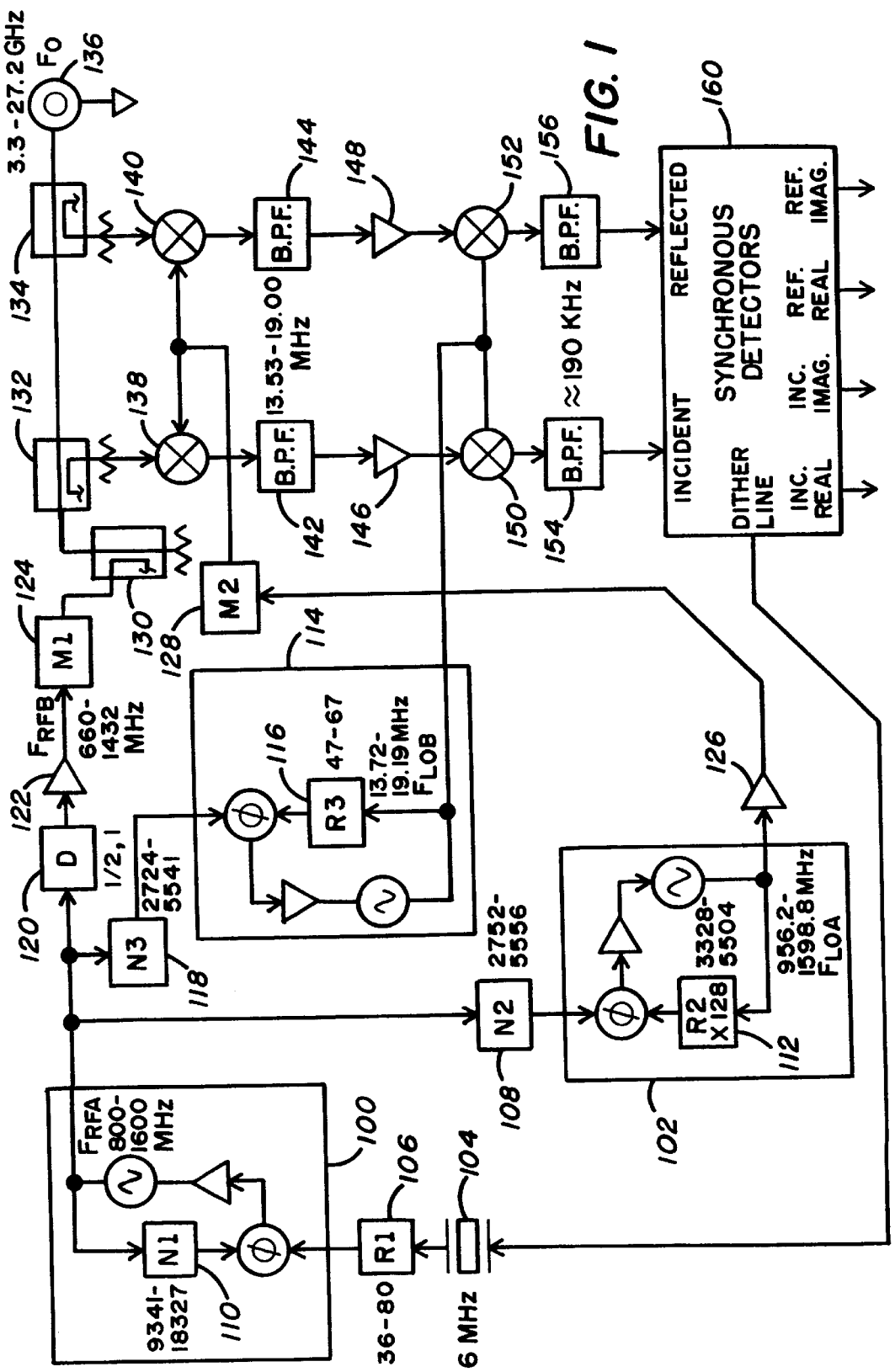
FIG. 1 shows components for the VNA of the present invention.

FIG. 1 shows components for the VNA of the present invention. In FIG. 1, representative values for frequencies and frequency division numbers for frequency dividers are shown for purposes of illustration, although other values may be used depending on desired operating conditions.

The test circuitry of FIG. 1 initially includes two phase locked loops (PLLs), or synthesizers, including a test signal synthesizer 100 and a first LO signal synthesizer 102. Each of the synthesizers 100 and 102 include a phase detector receiving an input signal to the synthesizer, and an amplifier, oscillator and frequency divider connecting the output of the phase detector back to a second input of the phase detector. The oscillator then provides an output of the synthesizers 100 and 102.

The input of the test signal synthesizer 100 is coupled to receive a reference signal from a reference signal oscillator 104 through a frequency divider 106. The frequency divider 106 divides the frequency from the oscillator 104 by a number R1 to provide an input to the test signal synthesizer 100. The input to the first LO signal synthesizer 102 is coupled to receive the output of the test signal synthesizer 100 through a frequency divider 108. The frequency divider 108 divides the frequency from the test signal synthesizer 100 by a number N2 to provide an input to the first LO signal synthesizer 102. Frequency dividers 110 and 112 in the respective test signal synthesizer 100 and tracking signal synthesizer 102 divide by respective numbers N1 and (R2× 128). The frequency divider 112 is referrably formed with series connected frequency dividers, one dividing by 128 and the next R2, rather than a single frequency divider due to potential limitations in operation speed when using a single frequency divider dividing by R2×128. Although a number 128 is chosen, other numbers may be utilized depending on the range of values desired for R2.

The value for the RF output from the test signal synthesizer 100, $F_{RFA}$, is $F_{RFA}=F_R N1/R1$. Resolution, or the steps between frequencies which can be provided for the RF signal $F_{OA}$ can be defined as follows:

$$\text{RES} = F_R(N1 - 1)/(R1 - 1) - F_R N1/R1$$
$$= F_R(N1 - R1)/(R1(R1 - 1))$$

Wherein $F_R$ is the frequency from the reference signal oscillator 104. Settling time for the signal $F_{RFA}$ is further defined as $t_{settle}=4.5/(2\pi F_R/10R1)$.

The values for R1 and N1 are chosen to optimize resolution and settling time for a particular frequency as described in detail in copending U.S. patent application No. 08/719,763 entitled "Frequency Synthesizer Using A Ratio Sum Topology, filed Sep. 25, 1996, and incorporated herein by reference. By iteratively selecting N1, N2, R1 and R2, as further indicated the U.S. patent application No. 08/719,763 referred to above, output signal resolution and settling time for the LO signal $F_{LOA}$ provided from the first LO signal synthesizer 102 can be minimized.

With the test signal provided from the VNA of the present invention having a high frequency, a second LO signal synthesizer 114 is included to provide a second downconversion to increase operation speed from a VNA using only one downconversion. Using two downconversions enables increased operation speed by enabling use of more coarse resolution synthesizers 102 and 114, the coarse resolution reducing settling time relative to a single fine resolution synthesizer used to provide only one downconversion. As with the synthesizers 100 and 102, the second LO signal synthesizer 114 includes a phase detector receiving an input signal to the synthesizer, and an amplifier, oscillator and frequency divider connecting the output of the phase detector back to a second input of the phase detector. The oscillator then provides the output of synthesizer 114.

The input of the second LO signal synthesizer 114 is coupled to receive the output of the test signal synthesizer 100 through a frequency divider 118. The frequency divider 118 divides the frequency from the oscillator 104 by a number N3 to provide an input to the second LO signal synthesizer 114. The frequency divider 116 in the synthesizer 114 divides signals received at its input by a number R3. By iteratively selecting N1, R1, N3 and R3, output signal resolution and settling time for the LO signal $F_{LOB}$ provided from the second LO signal synthesizer 114 can be minimized.

A series connected frequency divider 120 and amplifier 122 provide the test signal synthesizer 100 output to the input of a harmonic generator 124. The output of the LO signal synthesizer 102 is provided through an amplifier 126 to an additional harmonic generator 128.

The frequency divider 120 divides the output of the test signal synthesizer 100 by a number D, which is either ½ or 1, to provide a signal $F_{RFB}$ to the harmonic generator 124. The frequency divider 120 is utilized to increase the range of frequencies provided to the harmonic generator 124. For instance, with the test signal synthesizer operating over the range 800–1600 MHZ, the range of signals provided to harmonic generator 124 with a direct connection will be 800–1600 MHZ. However, by dividing the frequency of the signal from test signal synthesizer by ½, signals in the range of 400–1600 MHZ can be applied to the harmonic generator 124.

The harmonic generator 124 multiplies the frequency of its input signal $F_{RFB}$ by M1, as well as by other numbers to create multiple harmonics. Similarly, the harmonic generator 128 multiplies the frequency of its input signal $F_{LOA}$ by M2, as well as by other numbers to create multiple harmonics. The signal frequencies $F_{RFB}$ and $F_{LOA}$, however, are selected so that only the particular harmonics M1 and M2 will create an IF signal which is not filtered out, as described in more detail subsequently.

Figure 2:
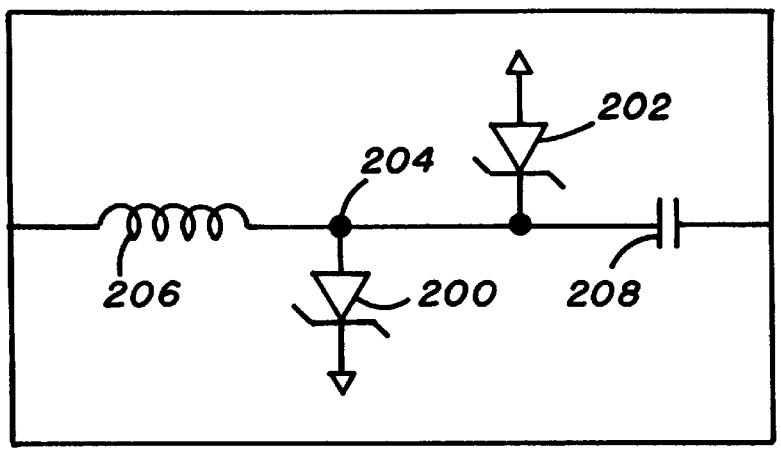
FIG. 2 shows circuitry utilized in the harmonic generators of FIG. 1.

FIG. 2 shows circuitry utilized in the harmonic generators 124 and 128 of FIG. 1. As shown, the harmonic generators 124 and 128 include two step recovery diodes (SRDs) 200 and 202. With the SRDs being p-n type diodes, the p side terminal of SRD 200 is connected to node 204 while its n side terminal is connected to ground. The SRD 202 then has a p side terminal connected to ground and an n side terminal connected to node 204. An inductor 206 connects the input of each harmonic generator to node 204. A capacitor 208 connects the output of each harmonic generator to node 204.

Figure 3:
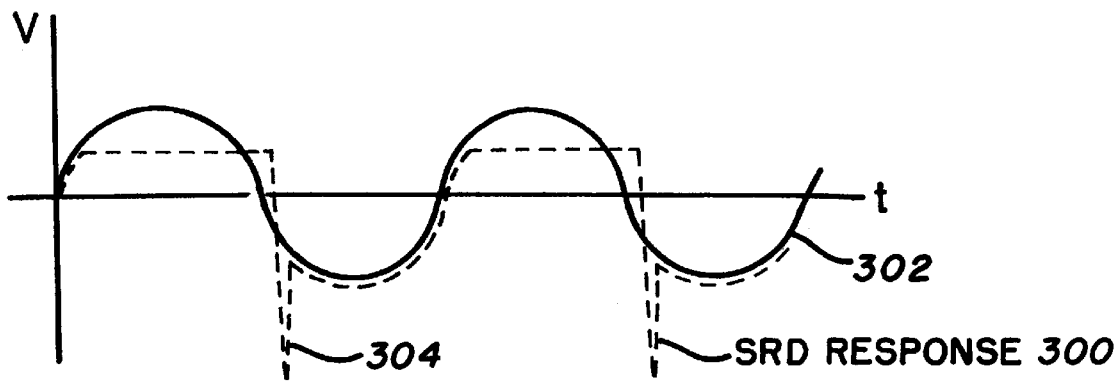
FIG. 3 shows the response of individual step recovery diodes (SRDs) in the harmonic generators of FIG. 2 to an input signal.

FIG. 3 shows a response 300 of individual ones of the SRDs 200 and 202 to an input signal 302. As shown, in contrast to a conventional diode, an SRD stores charge when forward biased and releases the stored charge when becoming reverse biased to create an impulse voltage, such as 304.

Figure 4:
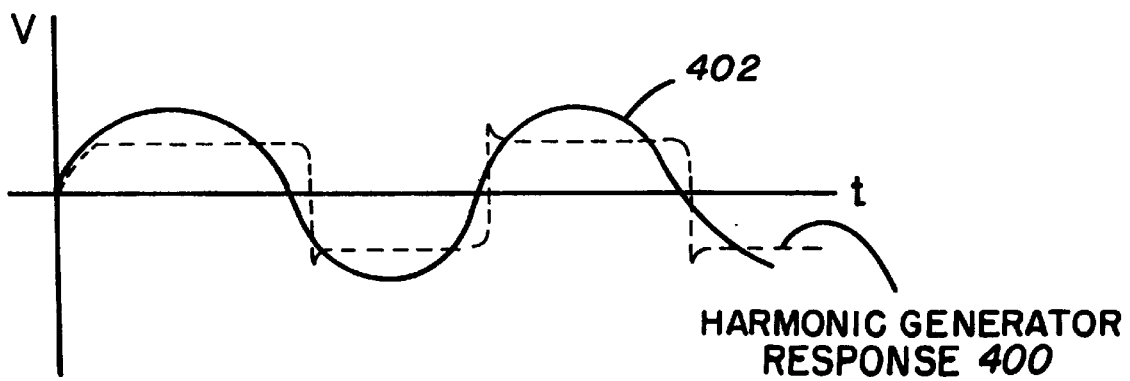
FIG. 4 shows the output of the harmonic generators with each harmonic generator including two SRDs as shown in FIG. 2.

FIG. 4 shows the output 400 of the harmonic generators 124 and 128 in response to an input signal 402, with each harmonic generator including two SRDs as shown in FIG. 2. As indicated, the pulse of each SRD is limited by charge storage capability in an opposing SRD, but edges of the output signal are very fast. With SRDs having opposing ends connected to the signal path as shown in FIG. 2, the signals having even harmonics will be canceled out, and only the odd harmonic signals will provide an output for the harmonic generators. With the SRDs connected in an opposing manner, the odd harmonics provided from the harmonic generators 124 and 128 will be enhanced relative to odd harmonics provided from a single SRD.

The inductor 206 of FIG. 2 serves to prevent the current provided from the pulses of the SRDs 200 and 202 from traveling back to components providing an input signal to the harmonic generator. Similarly, the capacitor 208 prevents the input signal, separate from the pulses provided by the SRDs 200 and 202, from being provided to circuit connected downstream from the harmonic generator.

The output of harmonic generator 124 is connected to a coupler 130. A through path of the coupler 130 connects the harmonic generator 124 to a termination. The coupling path of coupler 130 then connects a termination through the thru path of couplers 132 and 134 to a test port 136. The coupler 130 is utilized to provide the signal from the output of harmonic mixer 124 to the test port 136, rather than using a direct connection to the test port 136, to provide a flat power vs. frequency response.

Figure 5:
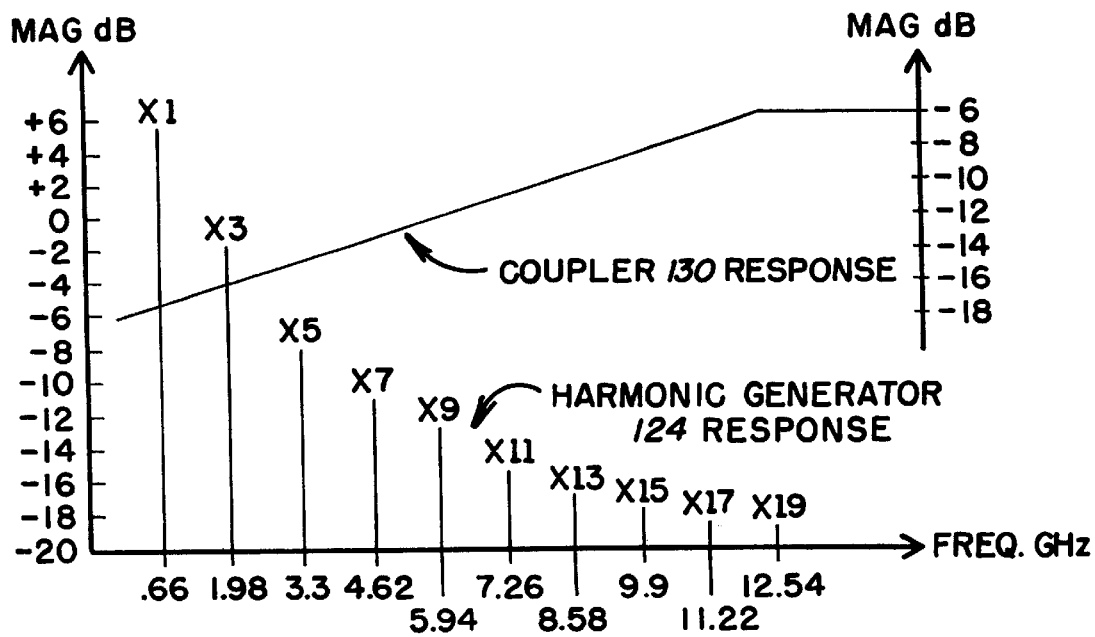
FIG. 5 shows a representative frequency vs. power response for odd harmonics of a harmonic generator as well as the frequency vs. power response for a coupler.
Figure 6:
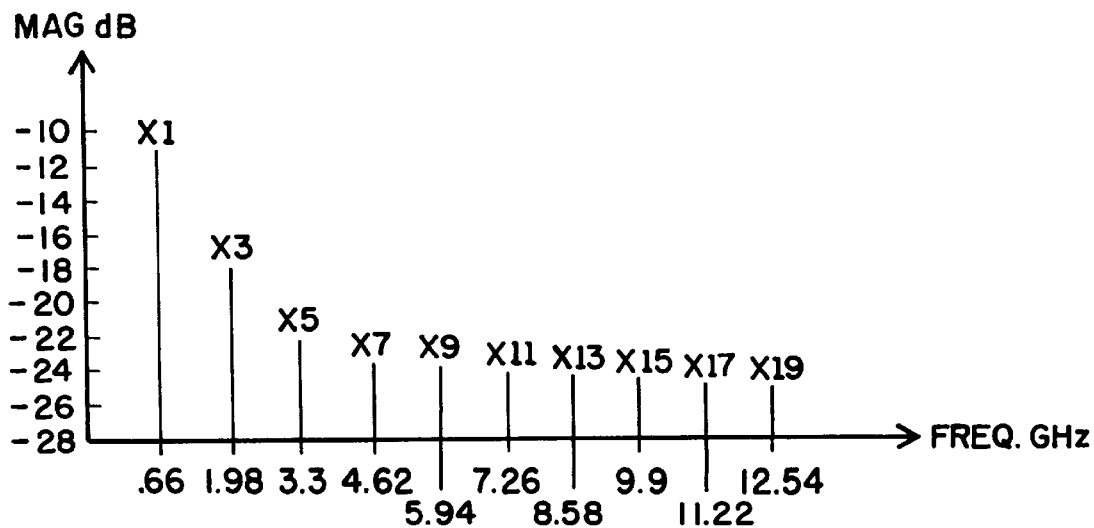
FIG. 6 shows the combined frequency vs. power response for the harmonic generator 124 and coupler 130 as combined from the responses in FIG. 5.

FIG. 5 shows a representative frequency vs. power response for odd harmonics 1–19 of harmonic generator 124 as well as a frequency vs. power response of coupler 130. As shown, with higher harmonics and, thus, higher frequency, the output power of the harmonic generator 124 decreases exponentially. The response of the coupler 130, as shown, provides increasing power with increasing frequency. FIG. 6 shows the combined frequency vs. power response for the harmonic generator 124 and coupler 130 as combined from the responses in FIG. 5. As shown in FIG. 6, the response of the higher harmonics is substantially flat. Further, the difference from the fundamental X1 to higher harmonics is approximately 12 dB in FIG. 6, while without coupler 130 the difference from the fundamental to higher harmonics is as high as approximately 24 dB as shown in FIG. 5.

To provide a coupler 130 having a response as shown in FIG. 5, component sizes for the coupler can be substantially reduced from a more typical coupler with components structured to provide a more flat frequency vs. power response. For representative frequencies shown in FIG. 1, the size of a coupler 130 can be less than 0.05 in. by 0.05 in. and provide a desirable response.

The coupling path of coupler 132 provides an incident RF signal to a first input of mixer 138. The coupling path of coupler 134 provides a reflected RF signal to a first input of mixer 140. Although a direct connection could be provided from coupler 130 to mixer 138, coupler 132 is used for a similar reason to coupler 130, as described below.

Couplers 132 and 134 preferably have a limited size to provide output power increasing with frequency, similar to coupler 130 as illustrated in FIG. 5. The output of harmonic generator 128 decreases in power with increasing frequency, similar to harmonic generator 124 as illustrated in FIG. 5, and is provided to second inputs of mixers 138 and 140. With the power output of couplers 132 and 134 increasing with frequency and the power output of harmonic generator 128 decreasing with frequency, the power output of mixers 138 and 140 will be substantially flat with frequency. With the power output of mixers 138 and 140 being substantially flat, saturation of the mixer outputs when higher power is provided can be minimized.

To assure a substantially equal loss is provided by the VNA to the incident and reflected RF signals so that incident and reflected signals can be later compared relative to one another, attenuation pads can further be provided between the couplers 132 and 134 and respective mixers 138 and 140. For representative frequencies shown in FIG. 1, the size of a couplers 132 and 134 can be less than 0.05 in. by 0.05 in. and provide a desirable response. For frequencies shown in FIG. 1, the total space required for couplers 130, 132 and 134 as well as the attenuation pads provided between coupler 132 and mixer 138 and coupler 134 and mixer 140 can be on the order of a 0.5 in. by 0.75 in. area. For a conventional system operating at 3.3 GHz, and couplers 130, 132 and 134 sized to provide a flat power vs. frequency response, each coupler would occupy a 3 in. by 0.5 in. area. The limited size for couplers 130, 132 and 134 in the present invention enables a VNA made using such components to have a minimal size to assure the VNA can be easily handheld by one person.

With mixer 138 mixing the incident RF signal with an LO signal, an incident intermediate frequency (IF) signal is provided from mixer 138 to bandpass filter 142. With mixer 140 mixing the reflected RF signal with a LO signal, a reflected IF signal is further provided from mixer 140 to bandpass filter 144.

The frequency of signals provided to harmonic mixers 124 and 128 are set so that the harmonic of a desired test signal Fo provided from harmonic generator 124 and the harmonic of a LO signal provided from harmonic generator 128 are both odd and offset by 2 and when mixed provide an IF signal within the pass band of filters 142 and 144. The passband of filters 142 and 144 are set so that the IF signal created by the desired test signal and selected LO signal will be passed, while remaining harmonics are filtered out.

Figure 7:
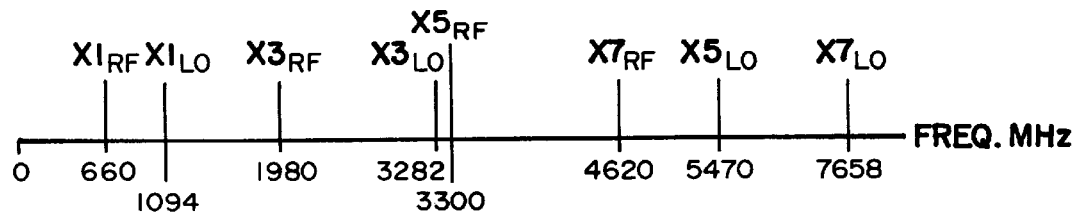
FIG. 7 shows first, third, fifth and seventh harmonics of a selected signal provided from the harmonic generators of FIG. 1.

The ability to filter out undesired harmonics for a 3.3 GHZ test signal Fo using filters 142 and 144 is illustrated in FIG. 7. FIG. 7 shows first, third, fifth and seventh harmonics ($X1_{RF}$, $X3^{RF}$, $X5^{RF}$ and $X7^{RF}$) of a signal provided from harmonic generator 124, along with first, third, fifth and seventh harmonics ($X1_{LO}$, $X3^{LO}$, $X5^{LO}$ and $X7^{LO}$) of a signal provided from harmonic generator 128. The first harmonic $X1_{RF}$ from harmonic generator 124 is shown set at 660 MHZ in FIG. 7, while the first harmonic $X1_{LO}$ provided from harmonic generator 128 is shown set to 1093 MHZ. The difference between the first harmonics $X1_{RF}$ and $X1_{LO}$, as would be provided from either of mixers 138 and 140, will be 443 MHZ which is outside the frequency bandwidth of filters 142 and 144. Similarly the difference in other combinations of harmonics as shown in FIG. 7 will be outside the bandwidth of filters 142 and 144, except the difference between $X5_{RF}$ and $X3_{LO}$. The difference between $X5_{RF}$ and $X3_{LO}$ is approximately 18 MHZ, a frequency within the bandwidth of filters 142 and 144. Note that the signal $X5_{RF}$ is at 3300 MHZ, which is the desired test signal Fo frequency.

Figure 8:
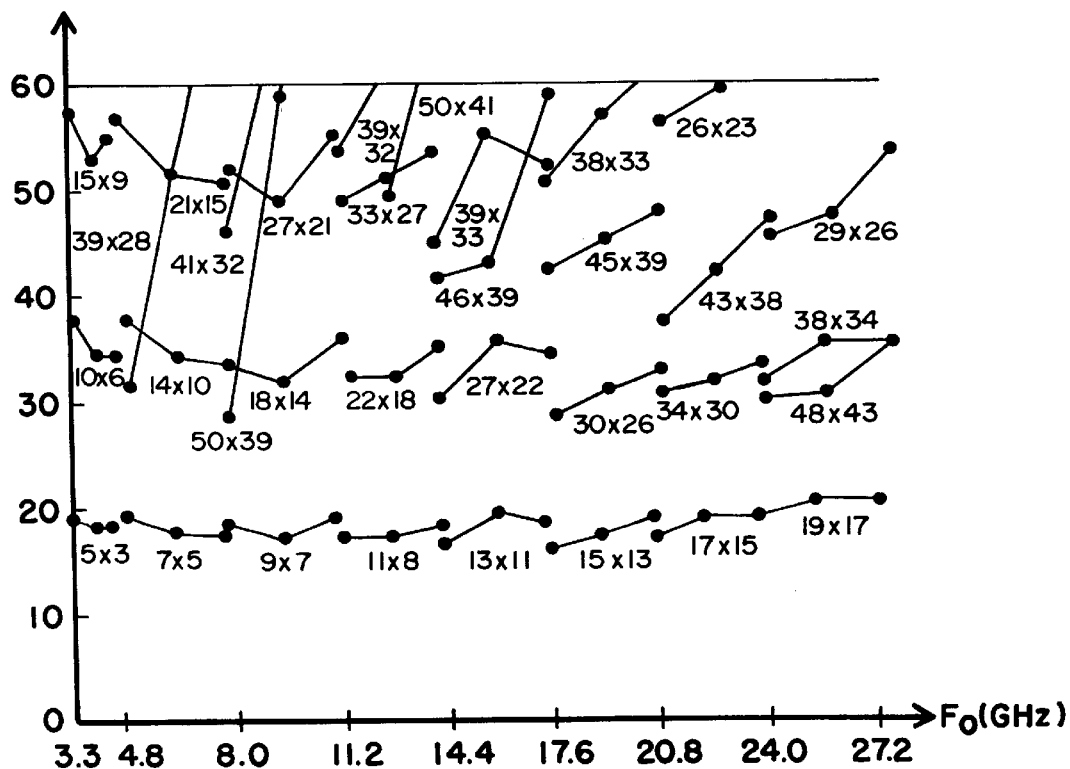
FIG. 8 plots desired test signal frequency vs. IF signals provided from the mixers of FIG. 1 at each test signal frequency.

FIG. 8 illustrates how desired output test signal Fo frequencies ranging from 3.3–27.2 GHz can be provided and undesired harmonics removed using filters 142 and 144. FIG. 8 plots desired test signal frequency Fo from 3.3–27.2 GHz vs. IF signal frequencies provided from mixers 138 and 140 for each test signal frequency. Harmonics numbers of the respective RF and LO signals forming the IF signals are further indicated in FIG. 8 with the plotted IF signals. As shown, for each desired Fo signal frequency in the range of 3.3–27.2 GHz, one IF signal be in the 13.53–19.00 MHZ bandwidth of the filters 142 and 144, the IF signal having been formed by RF and LO signals having odd harmonics separated by 2. Remaining IF signals formed by other harmonics of the RF and LO signals at each desired Fo signal frequency will be outside the 13.53–19.00 MHZ frequency band of filters 142 and 144.

To control the frequency of the first harmonic for the harmonic generators 124 and 128, the values for D, N1, R1, N2, and R2 are appropriately set. Appendix A includes a sample basic program used to calculate values for D, N1, R1, N2 and R2 to provide a set of test signals Fo ranging from 3.3 to 27.2 GHz. For each test signal frequency Fo, the program determines the signal $F_{RFB}$ provided to harmonic generator 124, the signal $F_{LOA}$ provided to harmonic generator 128, and the harmonics M1 and M2 provided from harmonic generators 124 and 128 which will create an IF signal with a frequency $F_{IF}$ within the passband region of filters 142 and 144. A result of a run of the program of Appendix A is shown in Appendix B.

Referring to the program of Appendix A, the program operates by reading 24 values for Fo beginning at lines 50 and 60. The data for the desired values of Fo are stored at lines 210, 220 and 230. After each value for Fo is read, results are calculated in a subroutine called at line 70 and results are then printed in lines 110–180. In the subroutine which begins at line 2000, the value for the reference frequency $F_R$=6 MHZ is first set in line 2110. In line 2020, M2 is then set to change every 1600 MHZ because the maximum value for $F_{LOA}$ is approximately 1600 MHZ. Step 2030 assures that M2 is odd, and step 2040 sets M1 to M2+2. Steps 2050–2060 set D to ½ when the desired frequency for $F_{RFA}$ will be less than 800 MHZ and otherwise sets D to 1. The remaining steps 2070–2260 of the subroutine calculate the values for N1, R1, N2, R2, N3, R3, $F_{RFB}$, $F_{LOA}$, and $F_{IF}$ for each particular value of Fo.

The output of filter 142 is provided through an amplifier 146 to a first input of mixer 150, while the output of filter 144 is provided through an amplifier 148 to a first input of mixer 152. Second inputs to mixers 150 and 152 are provided from the second LO signal synthesizer 114. The numbers R3 and N3 for frequency dividers 116 and 118 are set so that the IF signal provided from filters 142 and 144 will be downconverted to approximately 190 KHz. The outputs of mixers 150 and 152 are provided through respective filters 154 and 156 to synchronous detectors 160.

Two downconversions are utilized in the circuit of FIG. 1, one through mixers 138 and 140 and the other through mixers 150 and 152. Although components could be configured in the circuit of FIG. 1 to make the output of mixers 138 and 140 approximately 190 KHz using one conversion, two downconversions are preferrably used to increase operation speed, as discussed previously.

The filters 154 and 156 are band pass filters having a center frequency of approximately 190 KHz to filter out undesired harmonics from the output of mixers 150 and 152. The output of the mixers 150 and 152 is controlled to be approximately 190 KHz which is typically required at the input of the synchronous detectors 160. The synchronous detectors 160 function to convert the incident and reflected signals received into digital signals indicative of real and imaginary components of the incident signal and real and imaginary components of the reflected signal received. Components for a synchronous detector are described in U.S. Pat. No. 5,642,039, referred to previously. A digital signal processor can be utilized in place of the synchronous detectors, also as indicated in U.S. Pat. No. 5,642,039.

The synchronous detectors 160 may also include a dither line connected to reference oscillator 104 to enable operation of the VNA with minimal interference from external signals. The reference oscillator 104 operates at a frequency $F_R$ which is a chosen reference frequency with an offset, for example 6 MHZ±600 Hz. The dither line provides a signal causing the reference oscillator 104 to sweep the entire ±600 Hz range during each cycle of the IF signals from mixers 150 and 152 provided to the synchronous detectors 160. A signal provided from an external source at a particular frequency will interfere with only a portion of the signals in the ±600 Hz range, enabling the outputs of the synchronous detectors to be substantially unaffected by the external signal source. Specific circuitry for providing the dither line is disclosed in U.S. Pat. No. 5,642,039, referred to previously.

Although the invention has been described above with particularity, this was merely to teach one of ordinary skill in the art how to make and use the invention. Many modifications will fall within the scope of the invention, as that scope is defined by the following claims.

APPENDIX A

```
20 REM ! 3.3 to 2.7 GHz For Fo DISPLAYED !
30 PS = 128
40 CNT = 0
50 FOR I = 1 to 24
60 READ F
70 GOSUB 2000
80 IF CNT > 0 THEN 110
90 PRINT "F0  FRFB  M1  FLOA  M2  FIF"
100 PRINT "―――――――――――――――――"
110 PRINT USING "#####        ";F;
120 PRINT USING "#####.###    ";FRFA*D;
130 PRINT USING "##           ";M1;
140 PRINT USING "#####.###    ";FLOB;
150 PRINT USING "##           ";M2;
160 PRINT USING "##.###       ";FIF1
170 CNT = CNT + 1
180 IF CNT = 3 OR CNT = 6 OR CNT = 9 OR CNT = 12 OR CNT = 15
    OR CNT = 18 OR CNT = 21 THEN PRINT "―――――――――――"
190 NEXT I
200 END
210 DATA 3300, 4050, 4799, 4800, 6400, 7999, 8000, 9600, 11199,
    11200, 12800
220 DATA 14399, 14400, 16000, 17599, 17600, 19200, 20799, 20800,
    22400, 23999
230 DATA 24000, 25600, 27199
2000 REM ! CALCULATE D, N1, R1, N2, R2, N3, R3, GIVEN Fo !
2010 FR = 6   :   PS = 128
2020 M2 = 1 + INT(F/1600)
2030 IF M2 MOD 2 = 0 THEN M2 = M2 + 1
2040 M1 = M2 + 2
2050 D = 1
2060 IF F/M1 < 800 THEN D = 1/2
2070 R1N = INT(9600*FR*D*M1/F)
2080 FOR R1 = R1N TO R1N + 37
2090 N1 = INT (F*R1/(FR*D*M1) + .5)
2100 FRFA = FR*N1/R1
2110 F0 = FRFA*D*M1
2120 FE = F0-F
2130 IF ABS(FE) < M1/38 THEN 2170
2140 NEXT R1
2150 PRINT "NO SOLUTION AT";F;"MHZ"
2160 END
2170 K = (FRFA*D*M1-19)/(FOA*M2)
2180 FOBT = K*FRFA
2190 R2A = INT(FOBT/(PS*.285))
2200 R2 = R2A*PS
2210 N2 = INT(R2/K)
2220 FLOA = FRFA*R2/N2
2230 FIF1 = FRFA*D*M1-FLOA*M2
2240 R3 = INT (N2*(FIF1 + .19)/FRFA)
2250 N3 = INT ((FRFA*R3)/(FIF1 + .19))
2260 RETURN
```

APPENDIX B

| $F_O$ | $F_{RFR}$ | $M_1$ | $F_{LOA}$ | $M_2$ | $F_{IF}$ |
|---|---|---|---|---|---|
| 3300 | 660.000 | 5 | 1093.714 | 3 | 18.857 |
| 4050 | 810.000 | 5 | 1344.069 | 3 | 17.793 |
| 4799 | 959.800 | 5 | 1593.586 | 3 | 18.241 |
| 4800 | 685.714 | 7 | 956.236 | 5 | 18.820 |
| 6400 | 914.286 | 7 | 1276.539 | 5 | 17.306 |
| 7999 | 1142.706 | 7 | 1596.308 | 5 | 17.401 |
| 8000 | 888.909 | 9 | 1140.379 | 7 | 17.531 |
| 9600 | 1066.667 | 9 | 1369.033 | 7 | 16.767 |
| 11199 | 1244.348 | 9 | 1597.223 | 7 | 18.572 |
| 11200 | 1018.179 | 11 | 1242.600 | 9 | 16.562 |
| 12800 | 1163.633 | 11 | 1420.304 | 9 | 17.229 |
| 14399 | 1309.021 | 11 | 1597.883 | 9 | 18.289 |
| 14400 | 1107.692 | 13 | 1307.632 | 11 | 16.053 |
| 16000 | 1230.783 | 13 | 1452.841 | 11 | 18.918 |
| 17599 | 1353.768 | 13 | 1598.270 | 11 | 18.004 |
| 17600 | 1173.346 | 15 | 1352.719 | 13 | 14.854 |

APPENDIX B-continued

| F₀ | F_RFR | M₁ | F_LOA | M₂ | F_IF |
|---|---|---|---|---|---|
| 19200 | 1280.000 | 15 | 1475.704 | 13 | 15.854 |
| 20799 | 1386.585 | 15 | 1598.610 | 13 | 16.846 |
| 20800 | 1223.510 | 17 | 1385.592 | 15 | 15.799 |
| 22400 | 1317.628 | 17 | 1492.204 | 15 | 16.613 |
| 23999 | 1411.714 | 17 | 1598.781 | 15 | 17.430 |
| 24000 | 1263.184 | 19 | 1410.821 | 17 | 16.533 |
| 25600 | 1347.349 | 19 | 1504.764 | 17 | 18.639 |
| 27199 | 1431.512 | 19 | 1598.832 | 17 | 18.592 |

What is claimed is:

1. A vector network analyzer (VNA) comprising:

an RF signal synthesizer;

a LO signal synthesizer;

a first harmonic generator having an input coupled to the RF signal synthesizer and an output, the first harmonic generator for generating substantially only odd harmonics of the RF signal to form a broadband RF signal;

a second harmonic generator having an input coupled to the LO signal synthesizer and an output, the second harmonic for generating substantially only odd harmonics of the RF signal to form a broadband LO signal;

a first coupler having a through path with a first terminal coupled to the output of the first harmonic generator and a second terminal, and having a coupling path coupling a signal from the first harmonic generator to a first coupler output terminal;

a second coupler having a through path with a first terminal connected to the second terminal of the through path of the first coupler and a second terminal connected to a test port, and having a coupling path coupling a signal from the test port to a second coupler output terminal;

a first mixer having a first input coupled to the first coupler output terminal, a second input coupled to the output of the second harmonic generator, and having an output;

a second mixer having a first input coupled to the second coupler output terminal, a second input coupled to the output of the second harmonic generator, and having an output;

a first filter having an input coupled to the output of the first mixer and an output passing an incident IF signal formed from mixing harmonics of the broadband RF signal and the LO signal offset by two and filtering out signals formed from other harmonics; and a second filter having an input coupled to the output of the second mixer and an output passing a reflected IF signal formed from mixing harmonics of the broadband RF signal and the broadband LO signal offset by two and filtering out signals formed from other harmonics.

2. A vector network analyzer (VNA) comprising:

an RF signal synthesizer;

a LO signal synthesizer;

a first harmonic generator having an input coupled to the RF signal synthesizer and an output;

a second harmonic generator having an input coupled to LO signal synthesizer and an output;

a first coupler having a first path connecting the output of the first harmonic generator to a first termination and a second path connecting a first node to a second termination, the first coupler functioning to couple power from the first harmonic generator to the first node;

a second coupler having a through path coupling the first node to a test port and a coupling path coupling a signal provided to the first node to a second node;

a third coupler having a through path coupling the first node to the test port and a coupling path coupling a signal provided from the test port to a third node;

a first mixer having a first input coupled to the second node, a second input coupled to the output of the second harmonic generator, and having an output providing an incident IF signal; and a second mixer having a first input coupled to the third node, a second input coupled to the output of the second harmonic generator, and having an output providing a reflected IF signal.

3. The VNA of claim 1 wherein the first and second harmonic generators each comprise:

a first p-n diode having a p side terminal coupled to the input of the harmonic generator and an n side terminal coupled to a voltage potential; and a second p-n diode having an n side terminal coupled to the input of the harmonic generator and a p side terminal coupled to a voltage potential.

4. The VNA of claim 3, wherein the first and second p-n diodes comprise step recovery diodes.

5. The VNA of claim 1 further comprising:

a third coupler having a through path with a first terminal connected to the first terminal of the through path of the first coupler and a second terminal connected to a termination, and having a coupling path coupling the signal from the output of the first harmonic generator to the through path of the first coupler.

6. The VNA of claim 5, wherein the third coupler is sized to provide power to the through path of the first coupler increasing with frequency of a signal provided from the first harmonic generator.

7. The VNA of claim 2, wherein the first coupler is sized to provide power to the first node increasing with frequency of a signal provided from the first harmonic generator, wherein the second coupler is sized to provide power to the second node increasing with frequency of a signal provided through the through path of the second coupler, wherein the third coupler is sized to provide power to the third node increasing with frequency of a signal coupled from its through path to the third node.

8. The VNA of claim 6, wherein the first coupler is sized to provide power to the first coupler output terminal increasing with frequency of a signal provided to the first terminal of the through path of the first coupler, and wherein the second coupler is sized to provide power to the second coupler output terminal increasing with frequency of a signal provided to the second terminal of the through path of the second coupler.

9. A vector network analyzer (VNA) comprising:

an RF signal synthesizer;

a LO signal synthesizer;

a first harmonic generator having an input coupled to the RF signal synthesizer, and having an output;

a second harmonic generator having an input coupled to the LO signal synthesizer, and having an output, wherein the first harmonic generator and the second harmonic generator each comprise:

a first p-n diode having a p side terminal coupled to the input of the harmonic generator and an n side terminal coupled to a voltage potential; and a second p-n diode having an n side terminal coupled to the input of the harmonic generator and a p side terminal coupled to a voltage potential;

a first coupler having a through path with a first terminal coupled to the output of the first harmonic generator and a second terminal, and having a coupling path coupling a signal from the first harmonic generator output to a first coupler output terminal;

a second coupler having a through path with a first terminal connected to the second terminal of the through path of the first coupler and a second terminal connected to the test port, and having a coupling path coupling a signal from the test port to a second coupler output terminal;

a first mixer having a first input coupled to the first coupler output terminal, a second input coupled to the output of the second harmonic generator, and having an output; and a second mixer having a first input coupled to the second coupler output terminal, a second input coupled to the output of the second harmonic generator, and having an output.

10. The VNA of claim 9, wherein the first and second p-n diodes comprise step recovery diodes.

11. The VNA of claim 10 further comprising:

a third coupler having a through path with a first terminal connected to the first terminal of the through path of the first coupler and a second terminal connected to a termination, and a coupling path coupling a signal from the output of the first harmonic generator to the through path of the first coupler, wherein the third coupler is sized to provide power to the through path of the first coupler increasing with frequency of a signal provided from the first harmonic generator to the second coupler input terminal.

12. The VNA of claim 11, wherein the first coupler is sized to provide power to the first coupler output terminal increasing with frequency of a signal provided to the first terminal of the through path of the first coupler, and wherein the second coupler is sized to provide power to the second coupler output terminal increasing with frequency of a signal provided to the second terminal of the through path of the second coupler.

* * * * *